US006324672B1

(12) United States Patent
Lawman et al.

(10) Patent No.: US 6,324,672 B1
(45) Date of Patent: *Nov. 27, 2001

(54) METHOD FOR CONFIGURING CIRCUITS OVER A DATA COMMUNICATIONS LINK

(75) Inventors: Gary R. Lawman; Joseph D. Linoff, both of San Jose; Robert W. Wells, Cupertino, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/505,600

(22) Filed: Feb. 16, 2000

Related U.S. Application Data

(60) Division of application No. 08/832,989, filed on Apr. 4, 1997, now Pat. No. 6,118,938, which is a continuation-in-part of application No. 08/805,378, filed on Feb. 24, 1997, now Pat. No. 6,023,565, which is a continuation-in-part of application No. 08/625,480, filed on Mar. 29, 1996, now Pat. No. 5,673,198.

(51) Int. Cl.[7] .................................................... G06F 17/50
(52) U.S. Cl. .................................................. 716/1; 716/18
(58) Field of Search .................................. 716/1, 16, 17, 716/18, 11, 6

(56) References Cited

U.S. PATENT DOCUMENTS

| 4,162,536 | | 7/1979 | Morley .................................. 714/18 |
| 5,050,091 | | 9/1991 | Rubin ..................................... 716/10 |
| 5,109,353 | | 4/1992 | Sample et al. ........................ 716/17 |
| 5,111,413 | * | 5/1992 | Lazansky et al. .................... 703/14 |
| 5,351,197 | * | 9/1994 | Upton et al. . |

(List continued on next page.)

FOREIGN PATENT DOCUMENTS 0 645 723 A    3/1995   (EP) .

OTHER PUBLICATIONS

Goffart et al, "A Schematic Driven Synthesis Tools For Analog Circuits," IEEE, Jun. 1992, pp. 131–134.*

Hussey et al, "Object–Oriented Specification and Design of User–Interfaces," IEEE, Nov. 1996, pp. 336–337.*

Wing et al, "Towards Cooperative User Interfaces: An Object–Oriented Applications Integration Approach," IEEE, Dec. 1994, pp. 490–494.*

Nels Vander Zanden, "Synthesis of Memories From Behavioral HDLs," IEEE, Sep. 1994, pp. 71–74.*

(List continued on next page.)

*Primary Examiner*—Matthew Smith
*Assistant Examiner*—Vuthe Siek
(74) *Attorney, Agent, or Firm*—Lois D. Cartier; Michael R. Casey

(57) ABSTRACT

A method of specifying design parameters is provided for configuring circuits for programmable ICs. A design database describing a circuit is displayed in table-based format on a computer screen display. The design database may include a memory map including data to be placed in bit-storage space in the target programmable IC. This design database requires no schematics or HDL description of the circuit, even for complicated application-specific circuits. The desired parameters are entered by the user, typically using toggle buttons, pull-down menus, or keyboard entry. The selected parameters are then entered into the design database, thereby configuring the design database in accordance with the selected parameters. Next, the design database is transmitted over a data communications link such as the internet to a second computer, on which the compilation software resides. The design is then compiled and the resulting netlist is transmitted back to the originating computer. In one embodiment, a schematic symbol or HDL instantiation is also generated by the second computer, and transmitted back to the originating computer.

22 Claims, 17 Drawing Sheets

U.S. PATENT DOCUMENTS

| | | | |
|---|---|---|---|
| 5,544,222 | | 8/1996 | Robinson et al. .................... 455/557 |
| 5,557,748 | | 9/1996 | Norris .................................. 709/220 |
| 5,574,930 | | 11/1996 | Halverson, Jr. et al. .............. 712/34 |
| 5,603,043 | | 2/1997 | Taylor et al. ............................ 712/1 |
| 5,608,876 | | 3/1997 | Cohen et al. ........................ 710/101 |
| 5,673,198 | * | 9/1997 | Lawman et al. ....................... 716/11 |
| 5,684,980 | | 11/1997 | Casselman ............................ 703/23 |
| 5,691,912 | * | 11/1997 | Duncan ................................. 716/11 |
| 5,752,006 | | 5/1998 | Baxter .................................. 703/14 |
| 5,754,766 | | 5/1998 | Shaw et al. ......................... 709/200 |
| 5,761,484 | | 6/1998 | Agarwal et al. ...................... 716/16 |
| 5,802,290 | | 9/1998 | Casselman .......................... 709/201 |
| 5,864,486 | | 1/1999 | Deming et al. ....................... 716/17 |
| 5,870,308 | * | 2/1999 | Dangelo et al. ...................... 716/18 |
| 5,870,309 | * | 2/1999 | Lawman ................................. 716/6 |
| 5,898,595 | | 4/1999 | Bair et al. .............................. 716/2 |
| 5,963,454 | * | 10/1999 | Dockser et al. . |
| 6,023,565 | * | 2/2000 | Lawman et al. ........................ 716/1 |
| 6,118,938 | * | 9/2000 | Lawman et al. ...................... 716/16 |
| 6,151,609 | * | 11/2000 | Truong ................................ 707/505 |

OTHER PUBLICATIONS

Cheng, Edmund K. and Mazor, Stanley, "Silicon Compilation," Addison–Wesley Publication Co., 1988, pp. 361–405, Chapter 9: The Genesil Silicon Compiler. copy in 08/832,989.

Actel Corporation, "Designer Series for the X Window System User's Guide," 1994. copy in 08/832,989.

Xilinx, Inc., "LogiCore™ PCI Master and Slave Interface User's Guide," Version 1.1, Nov. 1, 1996. copy in 08/832,989.

Xilinx, Inc., "The Programmable Logic Data Book," 1996, pp. 4–11 through 4–23. copy in 08/832,989.

Trlica C: "Software Tools", IEEE Spectrum, vol. 34, No. 1, Jan. 1997, pp. 60–64, XP000691710. copy in 08/832,989.

Kim: "Automatic Behavioral Verilog Model Generation Using Engineering Parameters" Proceedings of the 1994 International Verilog HDL Conference, Mar. 14, 1994, XP002054697. copy in 08/832,989.

Won M. et al.: "VHDL Design of a Master—Target PCI Interface", Electronic Engineering, vol. 68, No. 835, Jul. 1996, pp. 39/40, 42 XP000627446. copy in 08/832,989.

*Condor Technical Summary*, by Allan Bricker, Michael Litzkow and Miron Livny, Jan. 28, 1992, (10 Pg.) copy in 08/832,989.

Geber et al. "Peripheral Component Interconnect (PCI) Interface with the Quicklogic QL16x24B, " IEEE, pp. 568–573. Copy in 08/823,989.

Geber et al "Peripheral Component Interconnect (PCI) Interface With The Quicklogic QL16x24B FPGA," IEEE, pp. 568–573, Sep. 1994.*

* cited by examiner

RAM FUNCTIONAL SPECIFICATION

| | | |
|---|---|---|
| Width: | > 8 | |
| Depth: | > 64 | |
| Timing: | FULL CYCLE | HALF CYCLE |
| Phase A | > PHASE A | (PHASE A) |
| Phase B | > PHASE B | (PHASE B) |

Slicing:

| | | |
|---|---|---|
| Slicing Mode: | NONE | COMMON |
| Number of Slices: | > 0 | |

PORT A:

| | | | |
|---|---|---|---|
| Data Flow: | READ | WRITE | READ WRITE |
| Drive Type: | DIRECT | PRECHARGED | |
| Address: | >A ADDR | (A ADDR) | |
| Data Out: | >A OUT | (A OUT) | |
| Drive Enable: | >TRUE | (A DRIVE) | |

PORT B:

| | | | |
|---|---|---|---|
| Data Flow: | READ | WRITE | READ WRITE |
| Address: | >B ADDR | (B ADDR) | |
| Data In: | >B IN | (B IN) | |
| Write Enable: | >B WE | (B WE) | |

Address Encoding:

| | | | |
|---|---|---|---|
| Address Width: | > 6 | | |
| Number of Ranges: | > 1 | | |
| Range 0: From: | > 0 | To: | > 63 |

METHOD FOR CONFIGURING CIRCUITS OVER A DATA COMMUNICATIONS LINK

CROSS-REFERENCE TO RELATED APPLICATIONS

This application is a divisional application of U.S. patent application Ser. No. 08/832,989 invented by Gary R. Lawman, Joseph D. Linoff, and Steven L. Wasson entitled "MEMORY MAP COMPUTER USER INTERFACE FOR PROGRAMMABLE ICS" and filed Apr. 4, 1997, and issued Sep. 12, 2000 as U.S. Pat. No. 6,118,938;

which is a continuation-in-part application of U.S. patent application Ser. No. 08/805,378 invented by Gary R. Lawman and Joseph D. Linoff entitled "METHOD FOR CONFIGURING CIRCUITS OVER A DATA COMMUNICATIONS LINK", filed Feb. 24, 1997, and issued Feb. 8, 2000 as U.S. Pat. No. 6,023,565;

which is a continuation-in-part application of U.S. patent application Ser. No. 08/625,480 invented by Gary R. Lawman and Robert W. Wells entitled "CONCURRENT ELECTRONIC CIRCUIT DESIGN AND IMPLEMENTATION" and filed Mar. 29, 1996, and issued Sep. 30, 1997 as U.S. Pat. No. 5,673,198, all of which are incorporated herein by reference.

BACKGROUND OF THE INVENTION

1. Field of the Invention

The present invention relates generally to the field of programmable Integrated Circuits (ICs), and more specifically to a user interface for configuring circuits for programmable ICs.

2. Description of the Background Art

Typical design tools for logical circuits are based on one of two paradigms: they are either language-based (e.g., described in Hardware Description Language, or HDL) or schematic-based (built from illustrations of circuit elements or gates). Many prior art design entry software tools are generic mechanisms for entering any manner of electronic or algorithmic design. The software typically stores the entered data as a database description, and may also process the data and save it as a netlist. A "netlist" is a description of a circuit comprising a list of low-level circuit elements or gates and the connections (nets) between the outputs and inputs thereof. The term "netlist" when used herein refers to either a hierarchical or a flattened netlist. A hierarchical netlist can instantiate (incorporate by reference) lower-level netlists instead of, or in addition to, lower-level elements or gates. A hierarchical netlist can be flattened to include the netlists that were instantiated therein. A flattened netlist does not instantiate any other netlists. A netlist is typically stored as one or more computer files.

Proprietary design entry software tools are created and sold by a number of different vendors, and there is little standardization throughout the industry. As a consequence, each of these tools forces the designer to learn to use the specific tool. This lack of standardization creates difficulties when designs must be translated from one design entry tool to another. Fortunately, the electronics industry is moving towards a common set of standards for the description of design databases and their associated connectivity, so database formats are sometimes compatible. When database formats are not compatible, the translation step takes place at the netlist level, if automated translation is possible at all. When database formats are compatible, the formats can be considered to use a "common language" which permits higher-level translation from one design entry tool to another.

However, the tools and the common database descriptions remain generic (capable of describing a wide variety of circuits) rather than application-specific (designed to describe a single type of circuit application). While a generic description is desirable as an abstraction for general design purposes and may be necessary if translating between different software tools, such a description can be limiting when evaluated in the context of a specific application. A specific application may be described in terms of high-level parameters that are relatively easy to understand, such as bus widths, ROM sizes, and the inclusion or omission of specific features. When the circuit is stored in a generic database description, such as a schematic or HDL code, it may be much more difficult to understand or correctly alter the circuit than if the high-level parameters are visually displayed.

In 1985, Silicon Compiler Systems (SCS) introduced a software product that allowed form-based entry of design parameters for logic blocks for custom ICs. This product is described by Edmund K. Cheng and Stanley Mazor on pages 361–405 of "Silicon Compilation", edited by Daniel D. Gajski, published in 1988 by Addison-Wesley Pub. Co., which pages are incorporated herein by reference. The SCS software presented a blank "form" on a computer screen. A limited set of forms was provided, with each form defining a different configurable circuit such as a RAM, ROM, PLA, datapath, or random logic. One such form, directed to a RAM circuit, is shown in FIG. 1. A "blank space" was identified in the form to be edited, and parameters were entered which described the desired behavior of the circuit. The software compiled the information thus entered and produced an IC layout, functional and timing simulation models, and a model for computing power consumption and transient currents. This form-based entry method provided a higher-level description of the desired circuit than the typical language-based or schematic-based entry method. A higher-level description is usually easier for a user to understand and edit. The form-based approach is therefore user-friendly.

In "Designer Series for the X Window System User's Guide", published in 1994 by Actel Corporation of Sunnyvale, Calif., which is incorporated herein by reference, a graphical user interface is described for entering feature selections for Field Programmable Gate Arrays (FPGAs). However, supported functions are limited to logic functions that can be used in many applications, being limited to counters, registers, decoders, adders, and multiplexers. Memory map entry is not supported. (The term "memory map" as used herein means a representation of a memory space (which may be virtual memory), wherein particular functions or data are addressable at preassigned locations. A memory map is made up of one or more fields, each of which can include more than one addressable memory location.)

Form-based and graphic-based user interfaces are therefore known in the art in the generation of custom and programmable ICs. However, application-specific circuits and other complicated circuits for programmable ICs are typically configured by editing either HDL code descriptions or complicated schematics. (The term "configuring" as used herein means entering or editing the user's vision of a circuit in a format readable by a computer.) In either case, the configuration of the circuit is time-consuming and error-prone. (The term "programmable ICs" as used herein includes but is not limited to FPGAs, mask programmable devices such as Application Specific ICs (ASICs), Programmable Logic Devices (PLDs), and devices in which only a portion of the logic is programmable.) Typically, design parameters entered using one of these prior art interfaces are stored into a design database and then compiled on the same computer.

Table-based formats often preserve valuable information in the form of a higher-level view of the functionality of a circuit than can be provided by displaying complicated schematics or HDL code descriptions. Thus, there is a need for a table-based user interface for configuring application-specific circuits and other complicated circuits for programmable ICs or portions thereof. (The term "table-based format" when used herein means a display that resembles one or more tables. A display in table-based format has one or more "cells" that resemble table cells, and typically each cell represents a different parameter.)

SUMMARY OF THE INVENTION

One aspect of the invention provides a computer user interface for providing design parameters for application-specific circuits and other complicated circuits for programmable ICs or portions thereof. The design parameters are displayed in table-based format, and can be entered and edited in this format. In response to a command from a user, the user interface enters these parameters in a design database that is then processed to form a netlist description of a desired circuit.

Two types of parameters may be specified: features and memory map data. Features are parameters that can be selected from a list of available options, or turned on and off by toggling "buttons" on the screen display, typically a computer monitor. Examples of features include Burst Mode and Enable Interrupts in a PCI circuit. The compilation software uses these features to determine what functionality, and therefore what logic, must be included in the resulting netlist. Memory map data which has been entered into a displayed table by the user is first entered into a design database, then entered into the netlist by the compilation software, and later programmed into bit-storage space in the programmable IC. Such bit-storage space may be real memory or virtual memory, and includes Read-Only Memory (ROM), registers, flip-flops, latches, configuration memory (programming memory in the programmable IC), and logic implementations such as electrical connection of a bit to a power supply or ground.

A first design flow according to the method of the invention is as follows: 1) the available parameters (such as feature selections or memory maps, or both) are presented to the user in table-based format on a computer screen display; 2) the user enters parameters for the circuit by selecting the desired features from the available feature selection, or by entering the desired data into the memory map, typically using toggle buttons, pull-down menus, or keyboard entry; and 3) the selected parameters are entered into the design database, thereby configuring the design database.

According to another aspect of the invention, additional steps of the method can include the compilation of the database and the generation of the netlist. The compilation software may also produce a symbol that can be used for schematic entry, or an "HDL instantiation" (a text file or a portion thereof written in an HDL language, instantiating a circuit and listing the inputs and outputs thereof) that can be used for HDL entry. One or both of the following steps can be added to the first design flow: 4) the design database is compiled to generate a netlist representing at least a portion of a programmable IC in accordance with the selected parameters; and 5) the compilation software also generates a schematic symbol or HDL instantiation that represents the generated netlist.

Known user interfaces for IC design entry software typically involve the compilation of design databases on the same computer where they are entered. With the current proliferation of remote data communications, particularly the internet, it is desirable to have the option of selecting parameters at a first location, transmitting the resulting design database over a data communications link to a second location, and compiling the design database at the second location. Preferably, the resulting netlist is then returned to the first location using a bidirectional data communications link. (The term "data communications link" as used herein includes but is not limited to the internet, intranets, Wide Area Networks (WANs), Local Area Networks (LANs), and transducer links such as those using Modulator-Demodulators (modems). The term "internet" as used herein refers to a wide area data communications network, typically accessible by any user having appropriate software. The term "intranet" as used herein refers to a data communications network similar to an internet but typically having access restricted to a specific group of individuals, organizations, or computers. A data communications link may be a wired network, a wireless network connected, for example, by radio or satellite communications, or a combination network.)

Therefore, according to yet another aspect of the invention, compilation of the design database can take place on a second computer. Some or all of the following steps can be added to the first design flow: 4) the configured design database is transmitted over a data communications link to a second computer; 5) on the second computer, the design database is compiled to generate a netlist representing at least a portion of a programmable IC in accordance with the selected parameters; 6) the compilation software also generates a schematic symbol or HDL instantiation that represents the generated netlist; 7) the generated netlist is transmitted over a data communications link to the computer where the database configuration was performed; and 8) the generated symbol or HDL instantiation is transmitted over the data communications link to the computer where the database configuration was performed. The generated netlist and the symbol or HDL instantiation may be transmitted over the data communications link in the same transmission.

BRIEF DESCRIPTION OF THE DRAWINGS

The present invention is illustrated by way of example, and not by way of limitation, in the following figures, in which like reference numerals refer to similar elements.

FIG. 1 shows a form used to enter parameters for a RAM block in the prior art software described by Cheng and Mazor in a publication edited by Gajski.

FIG. 2 shows a representation of a memory map according to one aspect of the invention that can be used to partially configure a Peripheral Component Interconnect (PCI) circuit. The memory map is implemented in viewlogic schematics.

DETAILED DESCRIPTION OF THE DRAWINGS

According to the invention, a user-friendly computer user interface for configuring circuits for programable ICs comprises a table-based method for entering data into a memory map. A representation of a memory map can be displayed on a computer screen in a table-based format, with each cell representing a field of the memory map. According to the invention, the data in a memory map can be entered and edited using a computer screen display and cursor controller such as a mouse, track ball, or keyboard.

Figure 2:
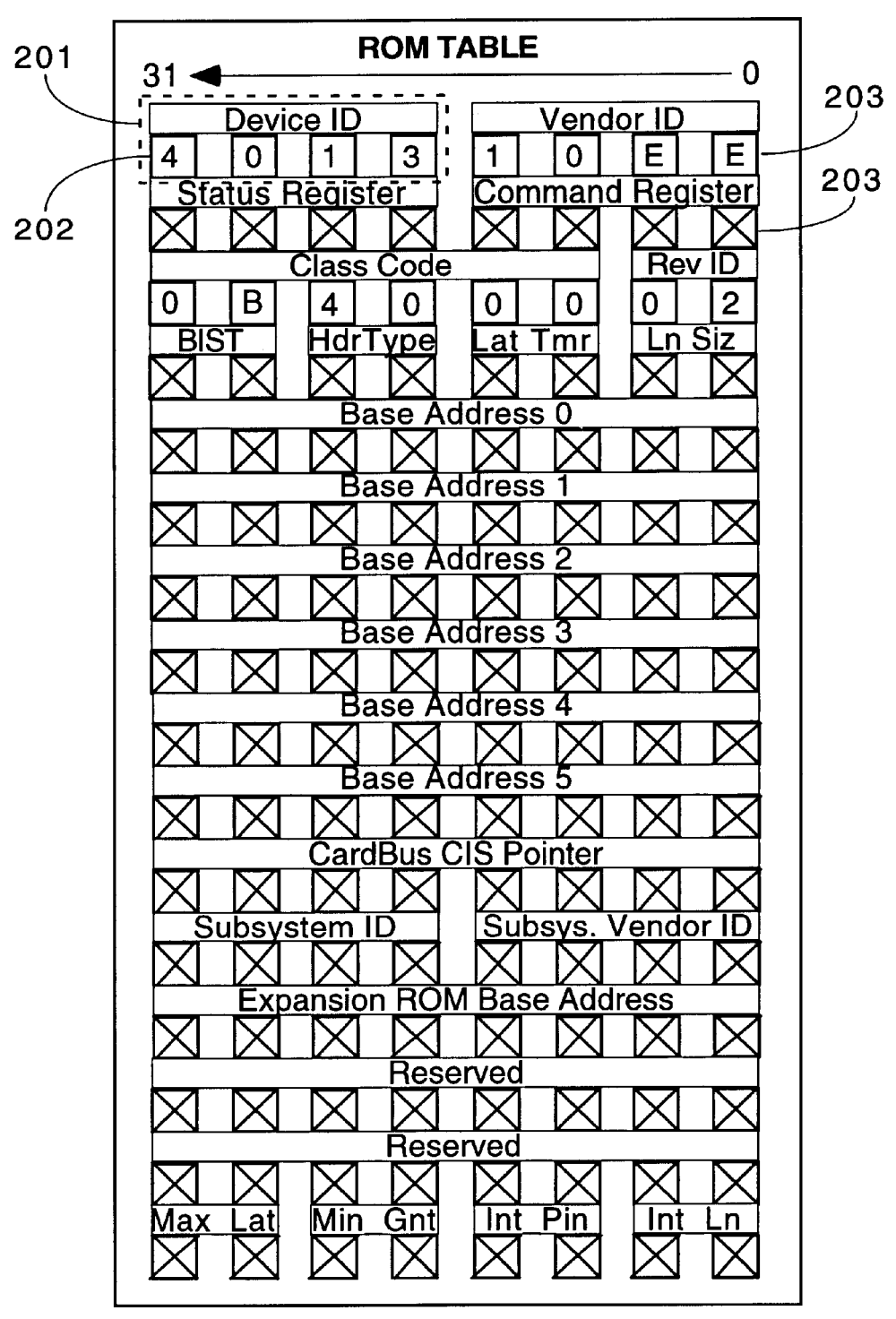

FIG. 2 shows the screen display for a memory map according to one aspect of the invention. The memory map of FIG. 2 is directed to the configuration of a PCI bus compatible interface circuit (hereinafter referred to as a PCI circuit) for an FPGA. PCI is an open, non-proprietary local bus standard offering high performance for multiple peripheral devices, and works as a processor-independent bridge between the CPU and high-speed peripherals. The memory map of FIG. 2 represents the PCI Configuration Space Header (CSH), a block of addressable memory that must be present in each IC implementing a PCI circuit. The PCI CSH has a standard format that includes several memory map fields, of which six are BARs.

Figure 3:
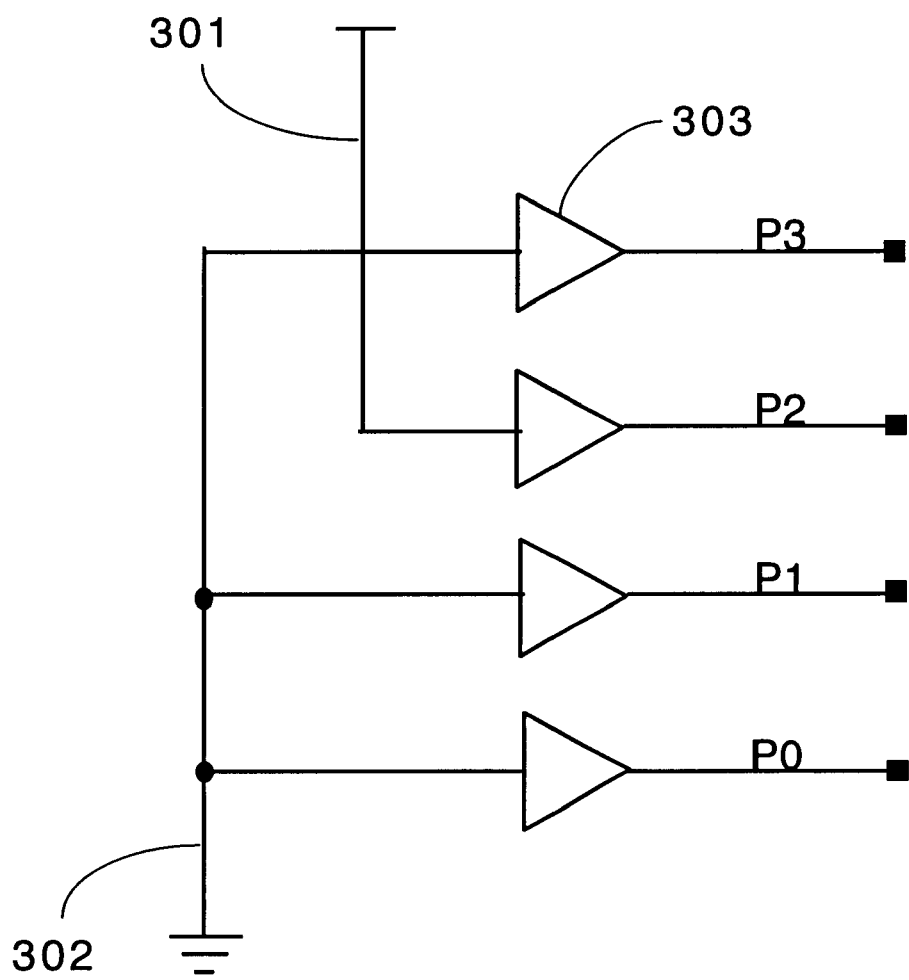
FIG. 3 shows a Viewlogic schematic used to implement a hexadecimal "4" value in a PCI Device ID register in the embodiment of FIG. 2.

In the user interface of FIG. 2, the design database for the memory map is implemented as a schematic entered using Viewlogic schematic design software. Each memory map field is implemented by the instantiation of a lower-level schematic in the memory map schematic. Each instantiated schematic is represented by a schematic symbol, such as 203 in FIG. 2. In the lower-level schematic, each bit is set to a known value. For example, the schematic "hex-4" (represented by schematic symbol 202) sets the four bits in a memory map field to "0100", thereby implementing the hexadecimal value "4". The schematic for "hex-4" is shown in FIG. 3. In the user interface of FIG. 2, the bits are set by electrically connecting each bit to a power supply 301 or ground 302 through a buffer 303. To change the contents of a memory map field in the user interface of FIG. 2, the schematic symbol representing that memory map field is selected and changed to another symbol. For example, to change the Device ID (201 in FIG. 2) from 4013 to 0013, the symbol "hex-4" (202 in FIG. 2) is changed to the symbol "hex-0". This method of configuring logic for programmable ICs is described on page 23 of the "LogiCore™ PCI Master and Slave Interface User's Guide", Version 1.1, published Nov. 1, 1996 by Xilinx, Inc. ("LogiCore" is a trademark owned by Xilinx, Inc.) The entirety of this document is incorporated herein by reference. Available schematics include "hex-0" through "hex-f", implementing circuits similar to FIG. 3 for decimal values 0 through 15, and "hex-x", implementing a location that is not supported (i.e., a location that returns a zero value at all times). All four bits in the schematic "hex-x" are sourced by ground driving through buffers.

The lower-level schematics hex-0 to hex-f and hex-x are connected to 32 16-bit multiplexers, which are implemented so that they do not show in the schematic display of this embodiment and therefore are not shown in FIG. 2. These multiplexers gather up the 16 vertically arranged bit contributions for each look-up table, thereby defining the complete set of look-up table bits for all 32 bits of all 16 addresses in the memory map. Each 16-bit multiplexer can be implemented in one look-up table function generator of a Xilinx XC4000-Series FPGA, described in pages 4–11 through 4–23 of the Xilinx 1996 Data Book entitled "The Programmable Logic Data Book", available from Xilinx, Inc., 2100 Logic Drive, San Jose, Calif. 95124, which are incorporated herein by reference.

After replacing all necessary symbols in the memory map schematic shown in FIG. 2, the configured memory map is saved into the design database. When the design database is compiled, the memory map data is entered into the netlist by the compilation software, and is later programmed into bit-storage space in the programmable IC.

The advantage of this data entry method is that displaying and editing memory map data in table-based format provides a user interface to the memory map that is more readily understood than the logic used to implement the circuit.

However, there are several drawbacks to this configuration method. Firstly, this user interface is dependent on software from a particular software company. The user is required to buy, load and learn to use a software tool such as the Viewlogic software. Secondly, the programmable IC vendor must supply schematics for not only the memory map, but also the rest of the PCI circuit, and further, whenever changes are made to the circuit, the vendor must send updated schematics to each user or make the new schematics available by other means. As a result of human error, different users may end up using different versions of the schematics. Thirdly, only memory map data can be changed using this table-based screen display. In the embodiment shown in FIGS. 2 and 3, feature selections are not displayed in table-based format. Feature selections can only be made by a complicated process that requires moving from level to level of the Viewlogic schematic, replacing, where necessary, schematic symbols representing schematics that do not support the desired features with symbols representing schematics that do support the desired features. The process associated with FIGS. 2 and 3 is fully described in pages 18–22 of the "LogiCore™ PCI Master and Slave Interface User's Guide", referenced above and incorporated herein by reference.

Detailed Example

The user interface of FIGS. 4–17 also configures a PCI circuit for an FPGA. However, this user interface is independent of any schematic or HDL software tool. Therefore, the user need not buy, load, or learn to use any schematic software. The programmable IC vendor need not supply the user with schematics for the circuit, nor send schematic updates to each user whenever changes are made to the circuit. The user can change both feature selections and memory map data using the table-based screen display. In the user interface of FIGS. 4–17, the screen display is especially user-friendly: it closely resembles the documented PCI specification provided by the PCI Special Interest Group (SIG). The user who is designing a PCI-compatible circuit is typically familiar with this document. Other circuits that can be configured using the method of the invention include First-In-First-Out memories (FIFOs), Universal Asynchronous Receiver-Transmitters (UARTs), Counter-Timer Circuits (CTCs) and many other well known standard circuits.

In the user interface of FIGS. 4–17, compilation of the design database takes place at a remote site, for example on a computer at the premises of the programmable IC vendor. The configured design database is transferred from the user's computer to the remote site over a bidirectional data communications link such as the internet, and the generated netlist is transferred back to the user's computer over the same data communications link. Therefore, the compilation software need not be shipped to the user, nor loaded onto the user's machine. The user interface software also need not be shipped to the user, as the software can be run by the user while it resides on a computer at the premises of the programmable IC vendor. Thus the user interface and compilation software are easily kept current at all times without the error-prone, costly, and time-consuming shipment and installation of updated software.

Another important benefit of this method is that error checking can be easily implemented as part of the user interface or the compilation software, based on simple rules that are specific to the particular circuit application.

The user interface and method of the invention simplify the configuration of circuits for programmable ICs, for both users and programmable IC vendors.

A user interface for configuration of a PCI circuit for use in a Xilinx FPGA according to the invention is now described in detail. The PCI circuit has several parameters; the following example describes the modification of both PCI feature selections and PCI memory map data. This embodiment of the user interface can be made available to users anywhere in the world who are designing PCI circuitry for use in a Xilinx FPGA.

Displaying Parameter Selection

1. The vendor (Xilinx) places a web page on the internet in a location to which users (e.g., Xilinx customers and potential customers) have access. In the screen display of the user's computer, the web page requests licensing and access passwords, which must be provided by the user in order to configure the design database. In this embodiment, the user interface will not write any output files unless the user accepts the license terms. This type of licensing requirement is well known to those skilled in the software art.

Figure 4:
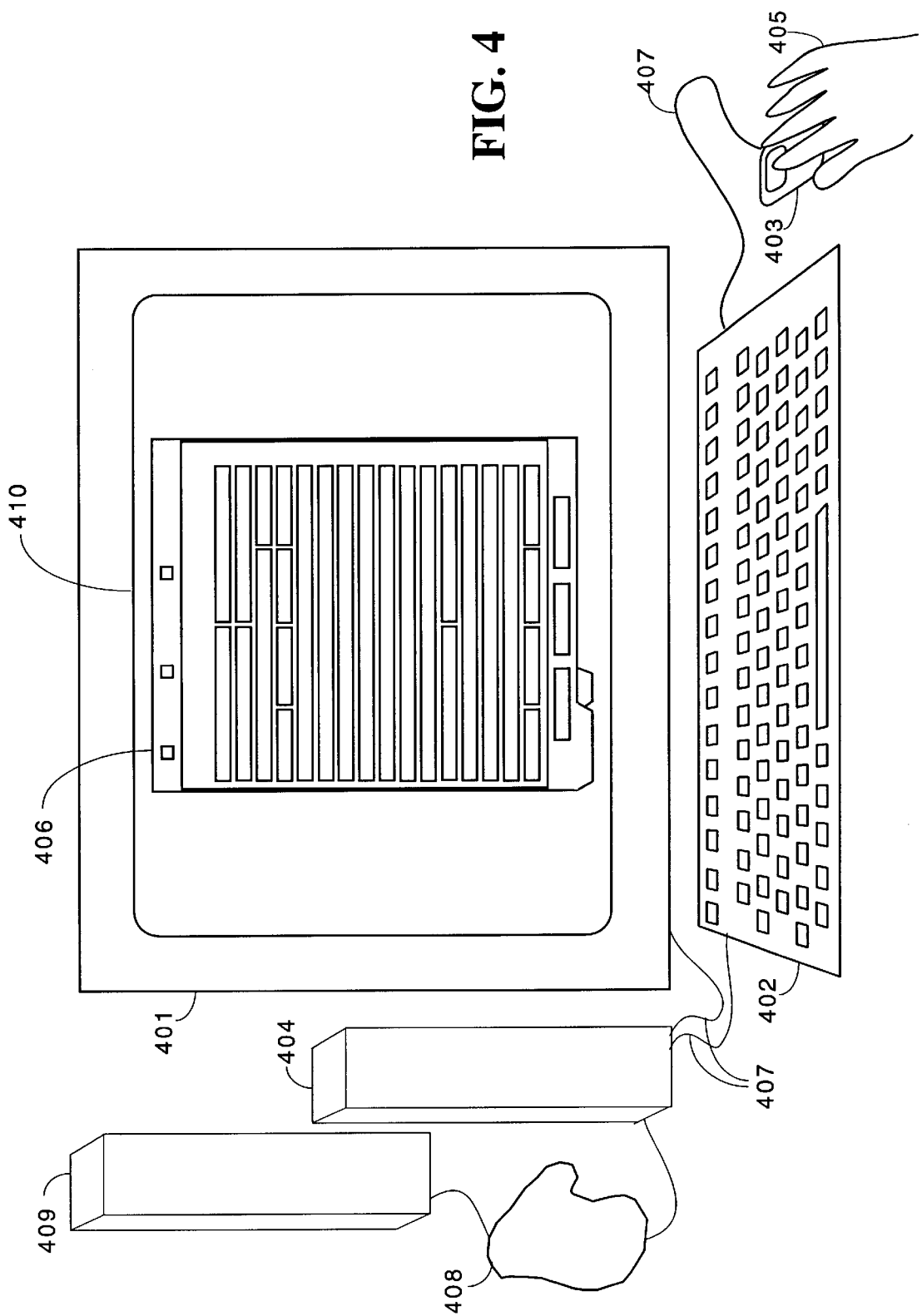
FIG. 4 shows a user's computer with a connection to a second computer over a long distance data communications link such as the internet, in accordance with the second aspect of the invention.

FIG. 4 represents the user's computer, in this embodiment comprising monitor 401, keyboard 402, mouse 403, and central processing unit (CPU) 404. (In another embodiment, the user's computer may comprise other components, such as a laptop computer or other terminal, rather than a monitor, keyboard, mouse, and CPU.) The user 405 uses mouse 403 and keyboard 402 to select parameters. Monitor 401 displays on its screen 410 parameter selection 406. Monitor 401, keyboard 402, mouse 403, and CPU 404 are connected using cables 407. CPU 404 is linked over internet 408 to a second computer 409, located in this embodiment at Xilinx headquarters. (This second computer is hereinafter referred to as the "Xilinx computer".)

2. When the user has provided the required passwords and accepted the licensing agreement, the user interface displays the parameter selection for a configurable PCI circuit in table-based format. In this embodiment, the parameter selection screen display is deliberately designed to closely resemble the memory map graphic presented in the PCI Special Interest Groups 2.1 PCI specification.

Figure 5:
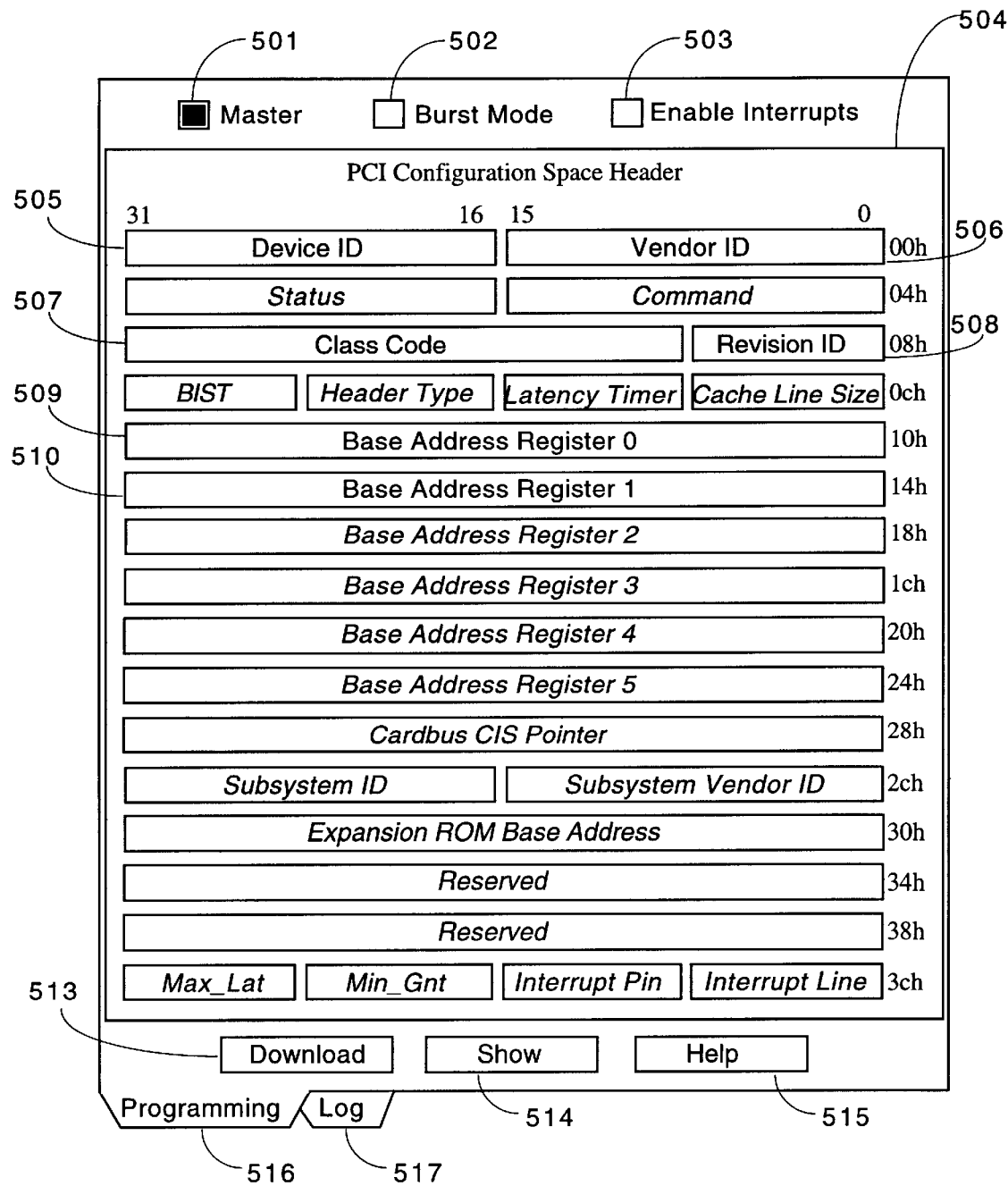
FIG. 5 shows a screen display wherein the table-based user interface includes "Programming" and "Log" displays. The "Programming" display is shown.

FIG. 5 shows the initial parameter selection screen display. Buttons 501, 502 and 503 are toggle buttons that control features of the PCI circuit (Master/Slave mode, Burst Mode Enabled or Disabled, and Interrupts Enabled or Disabled, respectively). (A "toggle button" is a portion of the screen display that, when clicked on with a mouse, selects a feature previously not selected, or de-selects a selected feature. Typically, the appearance of a toggle button changes when clicked on, to indicate whether the represented feature is selected or de-selected. A "button" may or may not be a toggle button. Clicking on a button that is not a toggle button typically either brings up a different pull-down menu or screen display, or causes the user interface to perform some action controlled by the button.) Note that the toggle button for Master mode 501 is selected in the initial default screen display, while the Burst Mode toggle button 502 and the Enable Interrupts toggle button 503 are not selected.

Also displayed for parameter selection is the PCI Configuration Space Header 504 (CSH). The PCI CSH is the memory map for the address space for controlling the PCI circuit. The Xilinx PCI circuit implements the first 64 bytes of a CSH. Memory map fields that are configurable using this user interface include Device ID 505, Vendor ID 506, Class Code 507, and Revision ID 508. The data selected by the user for these locations will eventually be stored in bit-storage space in the programmable IC, where they may be used by the host processor in the PCI system to identify the function of the programmable IC. The host processor is a processor in a PCI system that is assigned the task of configuring the PCI address space after a system reset.

In addition, the default configuration shown in FIG. 5 includes six Base Address Registers (BARs). In this embodiment, two BARs 509, 510 are configurable. The other BARs and other fields in the CSH memory map may optionally be configurable or displayable in another embodiment of this user interface. In one embodiment, the labels on configurable fields are displayed in a different color (black) than non-configurable fields (gray). In FIG. 5, configurable fields are labeled in regular text; non-configurable fields are labeled in italicized text.

Three buttons are displayed below the CSH table: Download 513, Show/Hide 514 and Help 515. These buttons are part of the user interface; they are not used for parameter selection. Clicking on Help button 515 brings up a display of on-line help (sometimes called "Wizards"), which may be used to guide the user through all or part of the desired parameter selection process. This type of user help is well established in the software industry, such as in programs which assist users in filling out their income tax returns. Application-specific Help displays may be provided in the same format as they appear in the PCI SIG 2.1 PCI specification. A Help display in the format of a corresponding specification is difficult to achieve in a tool such as schematic or HDL design entry software which is not targeted to a specific application. This capability assists designers by including some or all of the documentation provided in the specification for the circuit.

Show/Hide and Download buttons 514 and 513 are discussed below.

Figure 6:
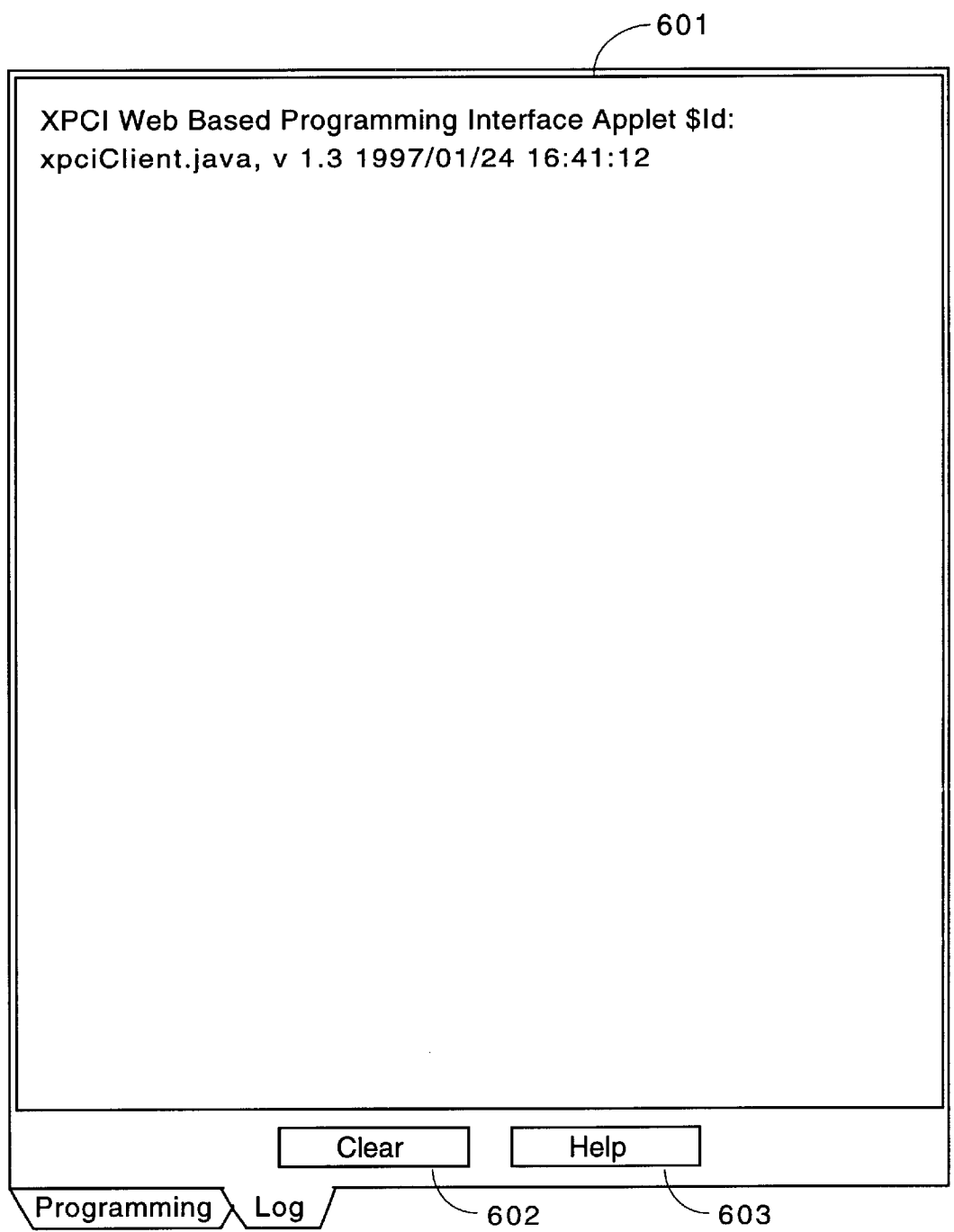
FIG. 6 shows the "Log" display from the screen display of FIG. 5.

The user interface of this embodiment has two available displays: the Programming display shown in FIG. 5 (the default display, which can also be selected by clicking on Programming tab 516), and a Log display (selected by clicking on Log tab 517). An example of the Log display is shown in FIG. 6. The Log display includes a text field 601 for displaying log messages, a Clear button 602 that clears the text display, and Help button 603 similar to Help button 515 on the Programming display.

Specifying Parameters

3. Using the Programming display of FIG. 5, the user then selects parameters by clicking on the various buttons. In this embodiment, the user interface software is part of the Xilinx web page. Therefore, when the user clicks on a button, an instruction is sent by the user's computer to the Xilinx computer over the internet. The user interface on the Xilinx computer then returns an instruction to the user's computer that modifies the screen display on the user's monitor. In this manner, the user proceeds to modify all relevant fields necessary to configure the PCI circuit as desired by that user. Several examples of parameter selection are now given.

Figure 7:
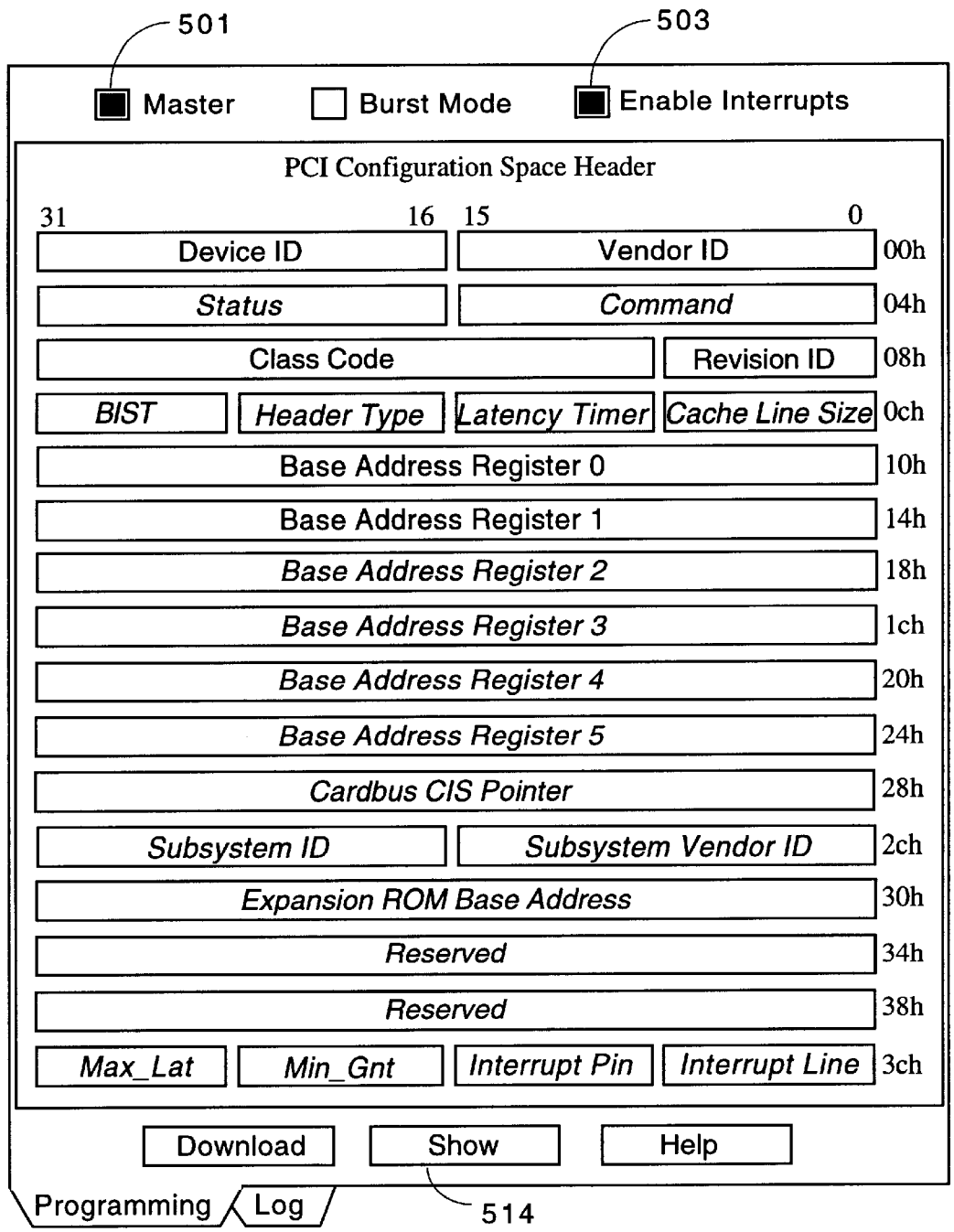
FIG. 7 shows the "Programming" display of FIG. 5 after selecting the Enable Interrupts feature.

4. The Enable Interrupt feature can be selected by clicking on the Enable Interrupts button 503. FIG. 7 shows the screen display after selecting Enable Interrupts. The selection of Master mode is independent of the selection of Enable Interrupts, so Master mode button 501 is still selected.

Figure 8:
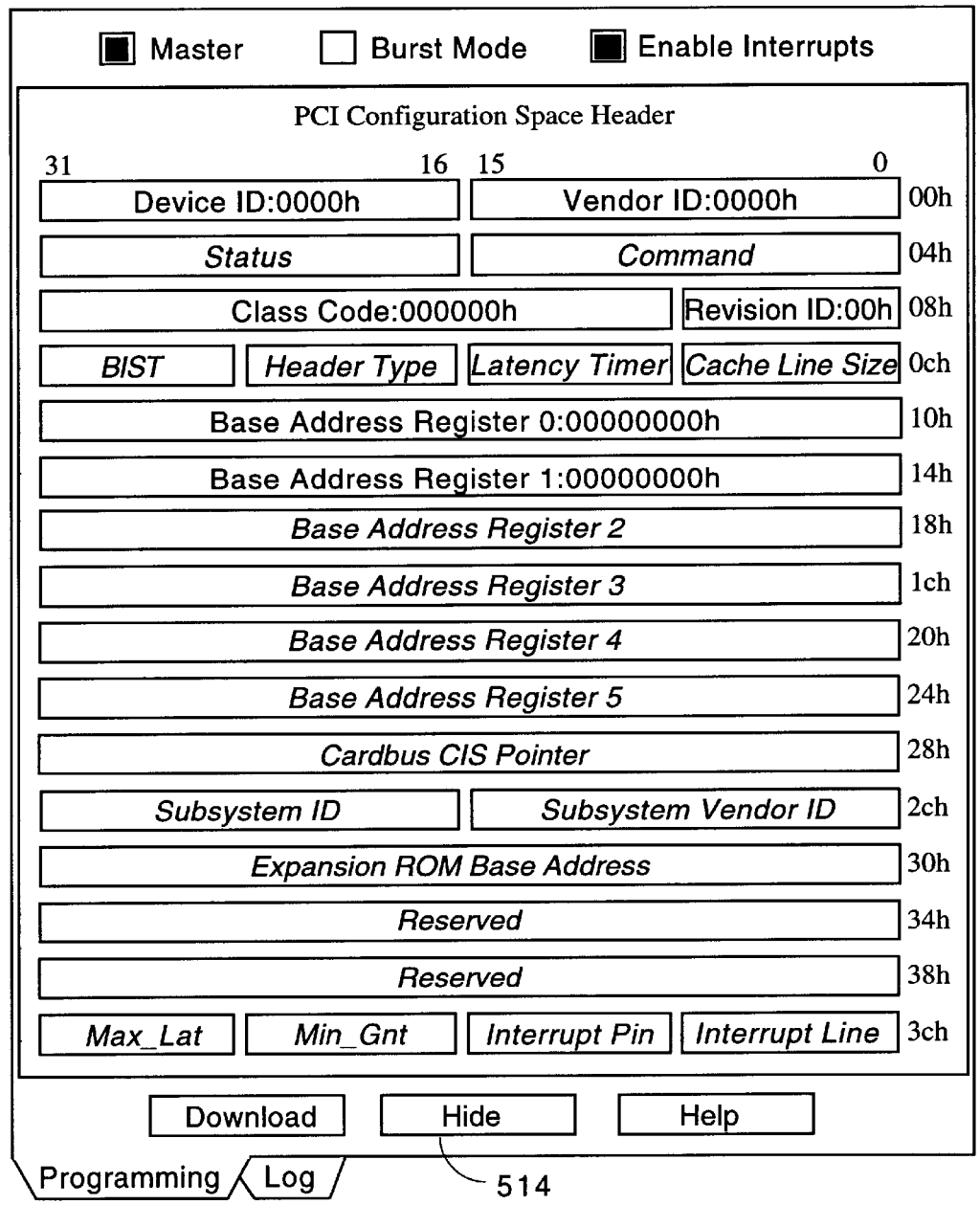
FIG. 8 shows the "Programming" display of FIG. 7 after "clicking on" the "Show" toggle button.

5. Use of the user interface Show/Hide button 514 is now explained in conjunction with FIG. 8. When the user clicks on Show/Hide button 514, the labels on the other configurable buttons change. The new labels show the values of the data in the memory map fields. This feature is helpful to users who wish to verify the data they have selected prior to configuring the database. Additionally, the label on Show/Hide button 514 changes from "Show" to "Hide", as shown in FIG. 8. The new label "Hide" makes it clear to the user that clicking on the button a second time will hide the data values now being displayed.

Figure 9:
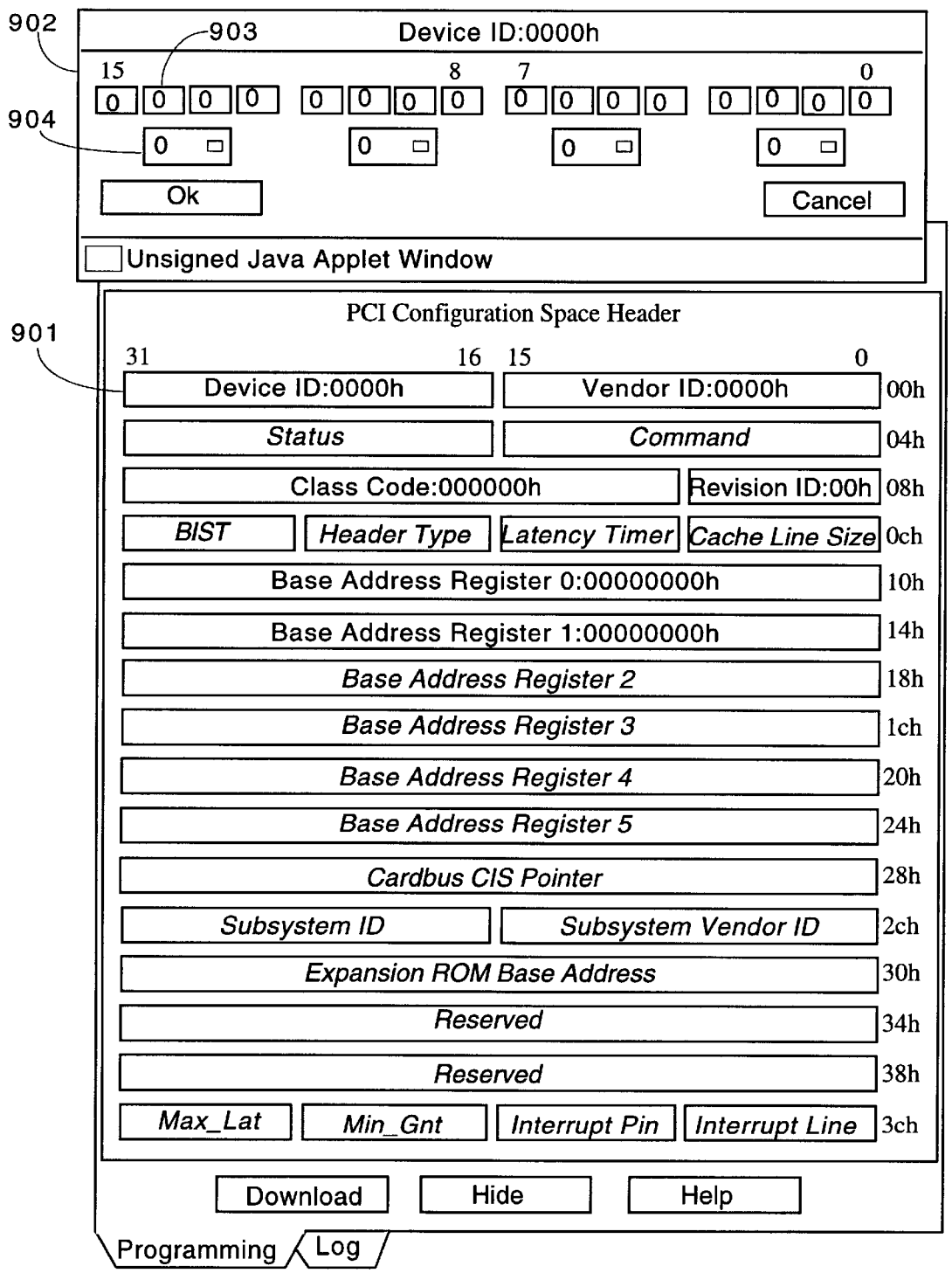
FIG. 9 shows a screen display of the PCI Device ID register in the default "all zeros" configuration.

6. As shown in FIG. 9, clicking on Device ID button 901 brings up a smaller screen display 902 (in this embodiment a pop-up window) that allows the user to enter a data value for the Device ID field. The Device ID field contains a 16-bit value that will be used to identify the vendor's device into which the PCI circuit is placed. Two methods of entering the data are supported by this embodiment. Clicking on bit buttons such as 903 toggles each bit between "0" (the default value) and "1". Clicking on nibble buttons such as 904 brings up a pull-down menu offering a choice of 16 values for the 4-bit field, 0 -F (hexadecimal). Another embodiment allows the user to type the data value in binary, hexadecimal, or other alpha-numeric formats using keyboard entry.

Figure 10:
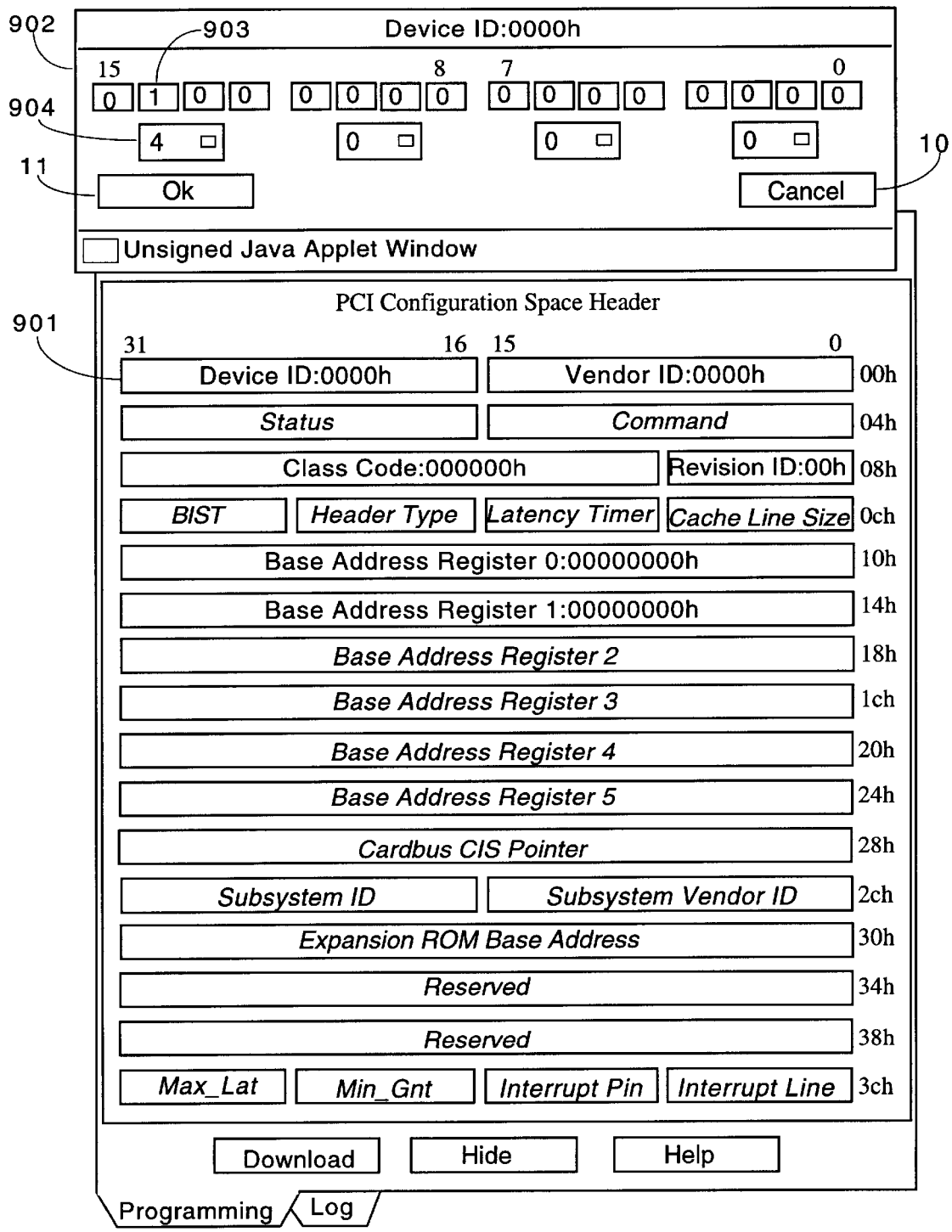
FIG. 10 shows the screen display of FIG. 9 after a user has entered a "1" in bit 14 of the Device ID register.
Figure 11:
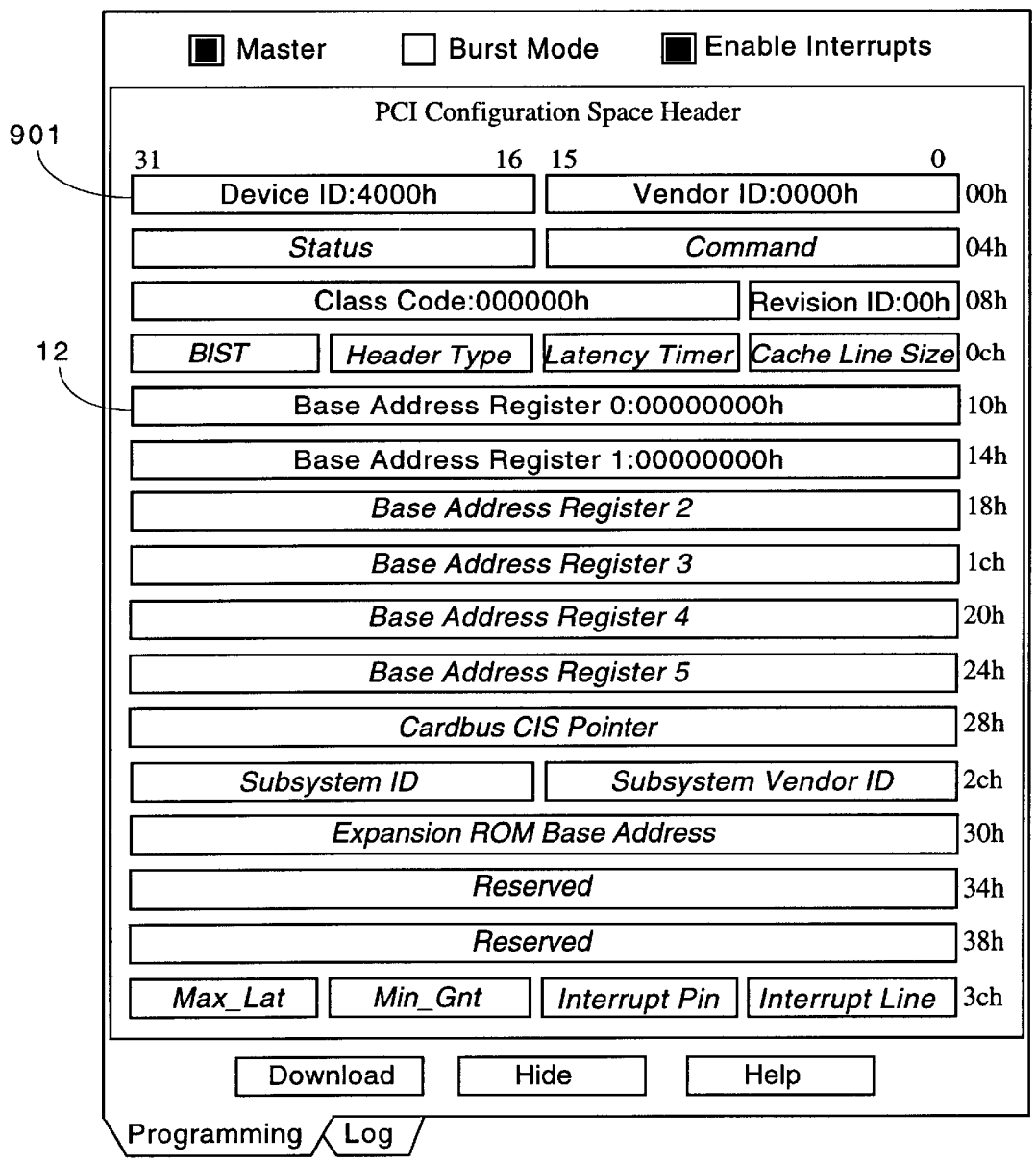
FIG. 11 shows the "Programming" screen display after entering "Ok" to accept the Device ID 4000 (hexadecimal).
Figure 12:
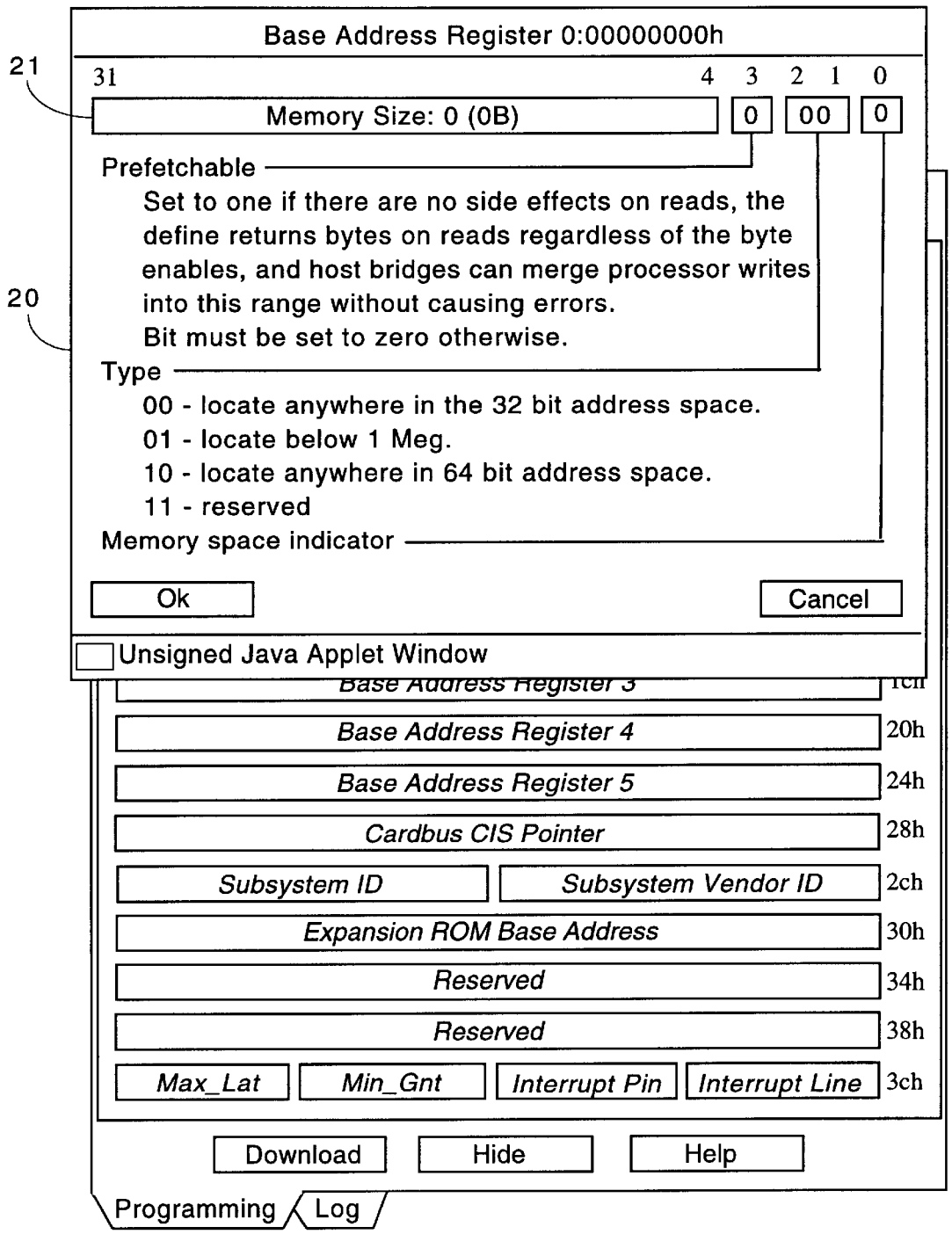
FIG. 12 shows a screen display for setting the memory size for BAR 0, a PCI Base Address Register (BAR), showing the default configuration.
Figure 13:
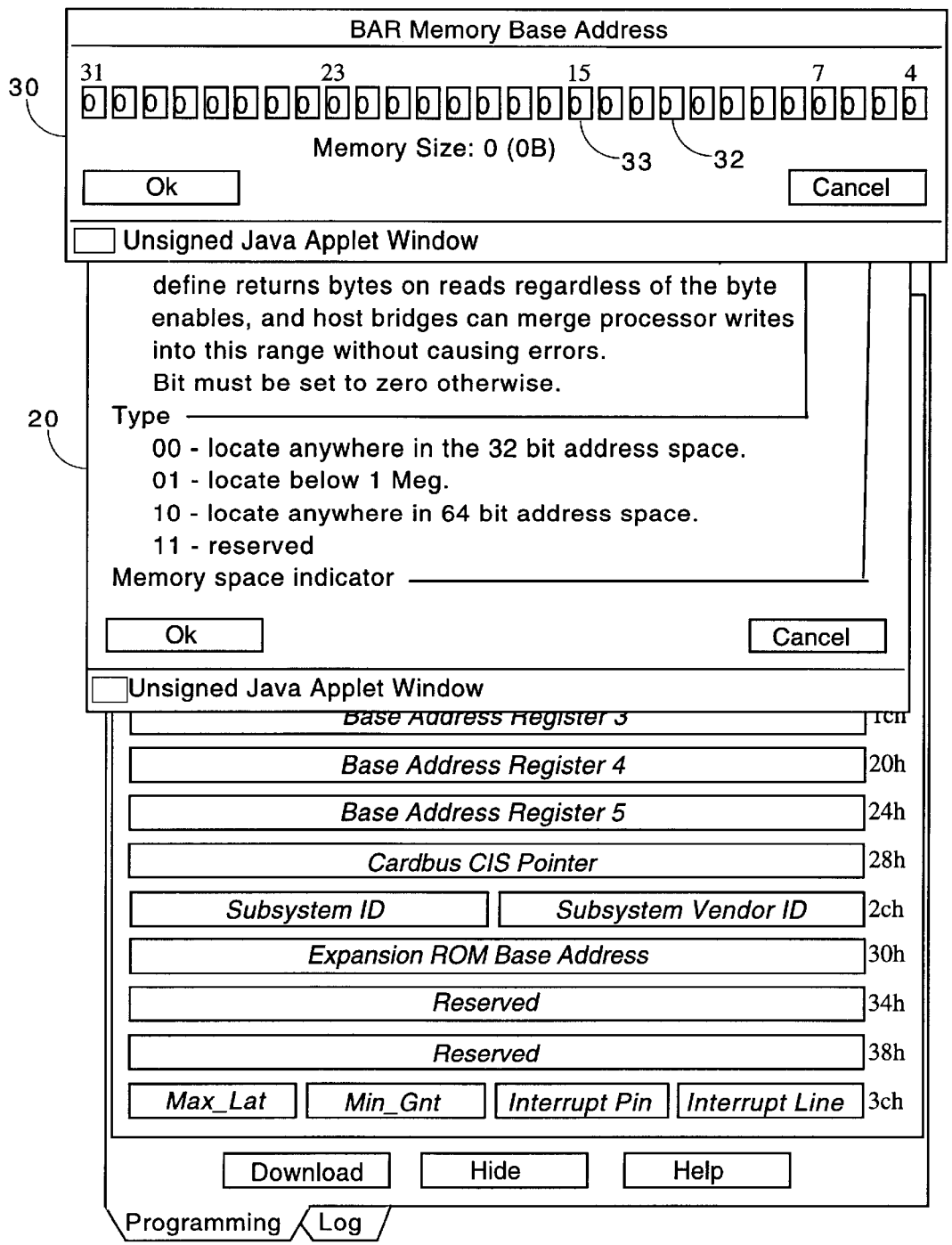
FIG. 13 shows a screen display for setting the memory size for BAR 0 after clicking on "Memory Size: 0 (0B)" in the screen display of FIG. 12. The screen display of FIG. 13 is shown in the default "all zeros" configuration.

FIG. 10 shows the screen display after selecting either bit button 903 (representing bit 14 of the Device ID) or nibble button 904 (representing bits 15–12 of the Device ID). When the Device ID is altered using either method, the screen display shows the new value as a label on both bit button 903 and nibble button 904. Clicking on Cancel button 10 cancels the change to the data selection. Clicking on Ok button 11 accepts the selection and removes small screen display 902. The Programming screen display is returned, as shown in FIG. 11. Note that Device ID button 901 is now labeled with the new data value: 4000 (hexadecimal).

Figure 14:
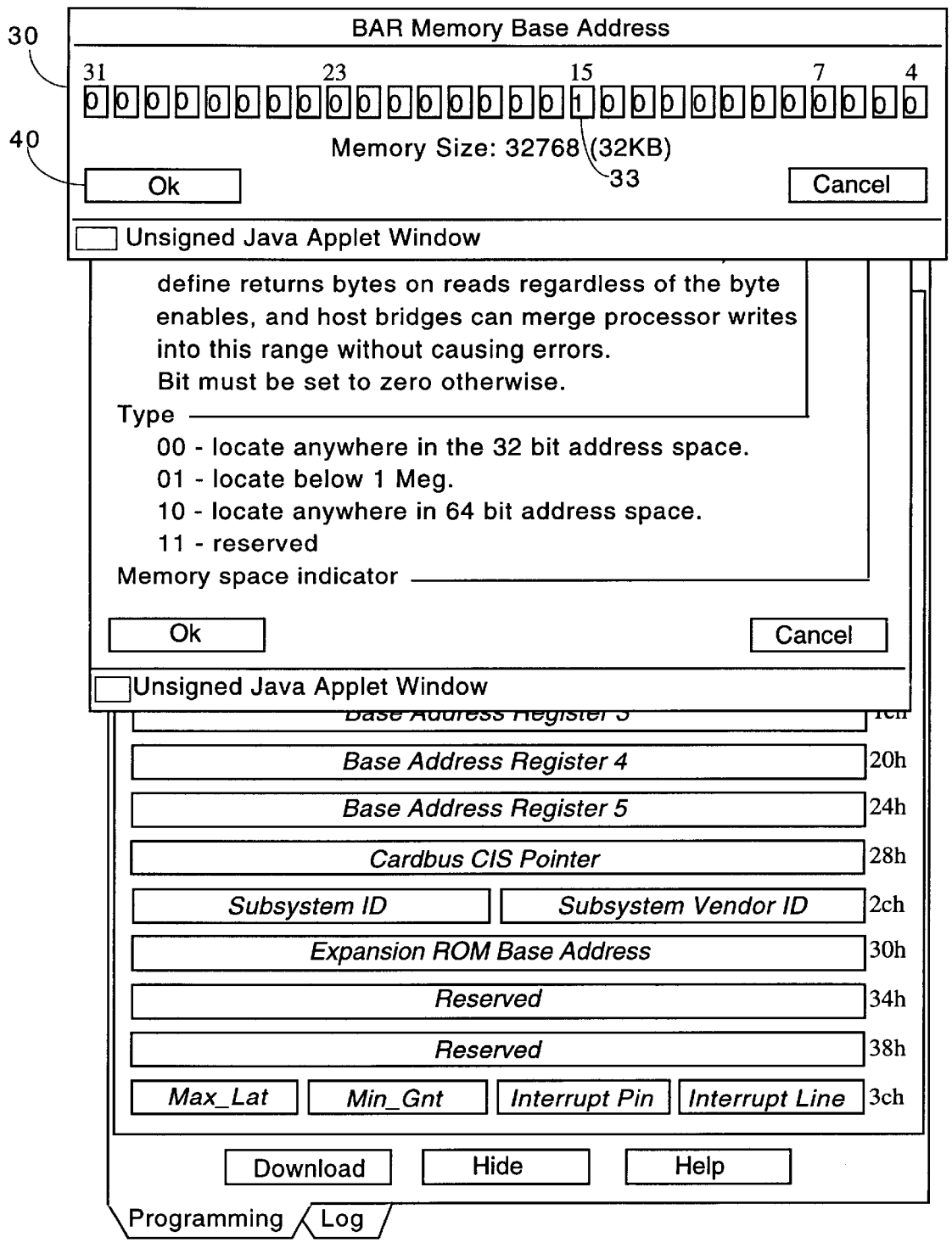
FIG. 14 shows the screen display of FIG. 13 after a user has entered a "1" in bit 15 of BAR 0.
Figure 15:
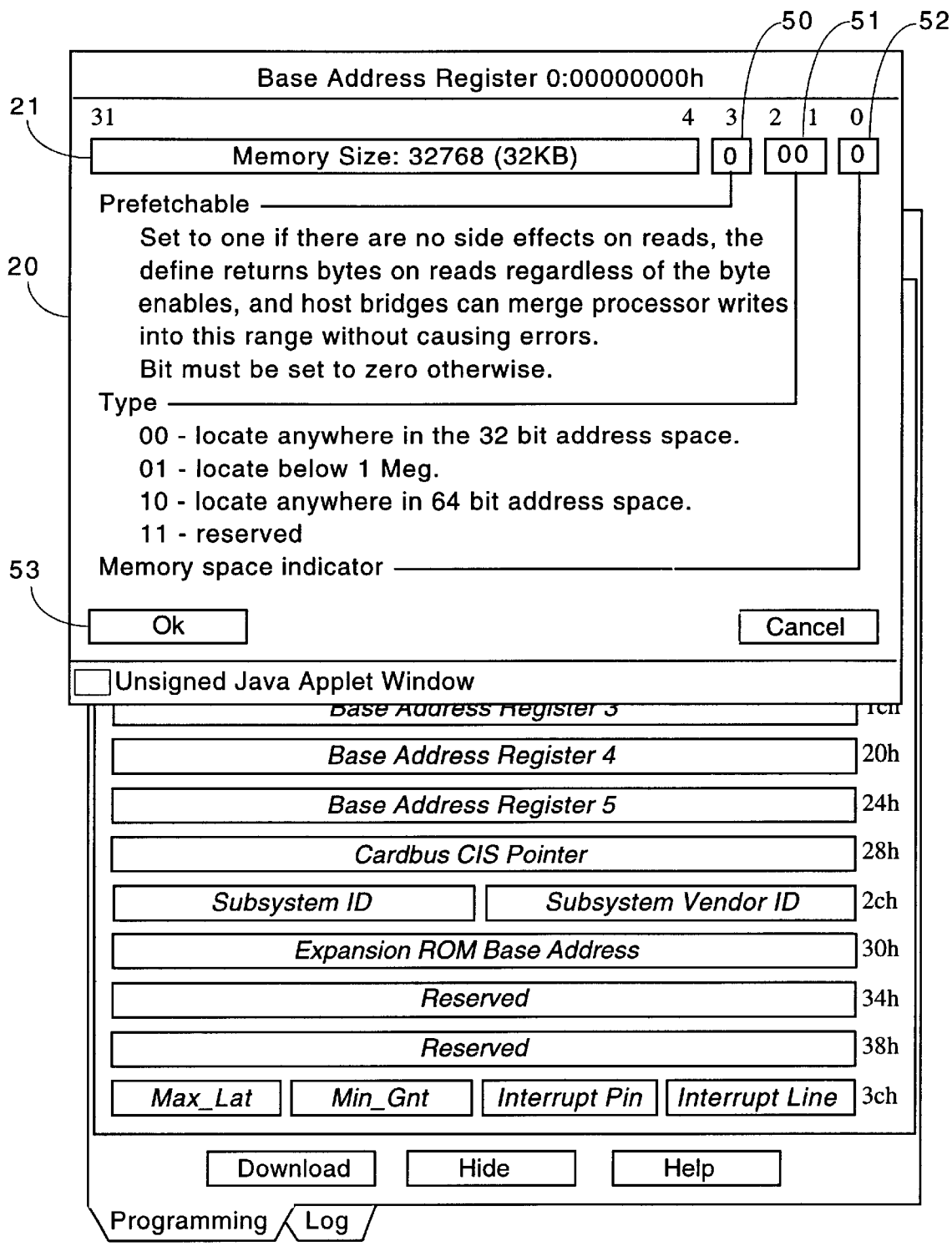
FIG. 15 shows the screen display of FIG. 12 after clicking on "Ok" to accept the BAR memory size of 00008000 (hexadecimal), shown as 32,768 (decimal).

7. The data value of Base Address Register 0 is now modified from its default value of all zeros. Clicking on BAR 0 button 12 in FIG. 11 brings up a smaller screen display 20 shown in FIG. 12 that allows the user to enter data values for this field. One data value the user can enter sets the size of the BAR 0 register. Note that screen display 20 includes useful application-specific information about the fields shown in screen display 20 to assist the user with parameter selection. Clicking on Memory Size button 21 brings up a new screen display 30 shown in FIG. 13 that permits selection of the memory size for BAR 0. In screen display 30, only one bit button (such as bit button 33) can be selected at a time. Selecting a second bit button 32 would de-select the previously selected bit button. FIG. 14 shows the screen display after selecting bit button 33, corresponding to bit 15 of the BAR 0 register. Note that the memory size is now displayed as 32,768 bits (32 KB). Clicking on Ok button 40 accepts the selection and removes screen display 30, as shown in FIG. 15. Note that Memory Size button 21 is now labeled with the new memory size.

Buttons 50, 51, and 52 select other features of BAR 0. Buttons 50 and 52 toggle between values of 0 and 1. However, button 51 demonstrates yet another data entry method. Button 51 represents two bits, and clicking on button 51 changes the value 00 to 01, 01 to 10, 10 to 11, and 11 to 00.

Figure 16:
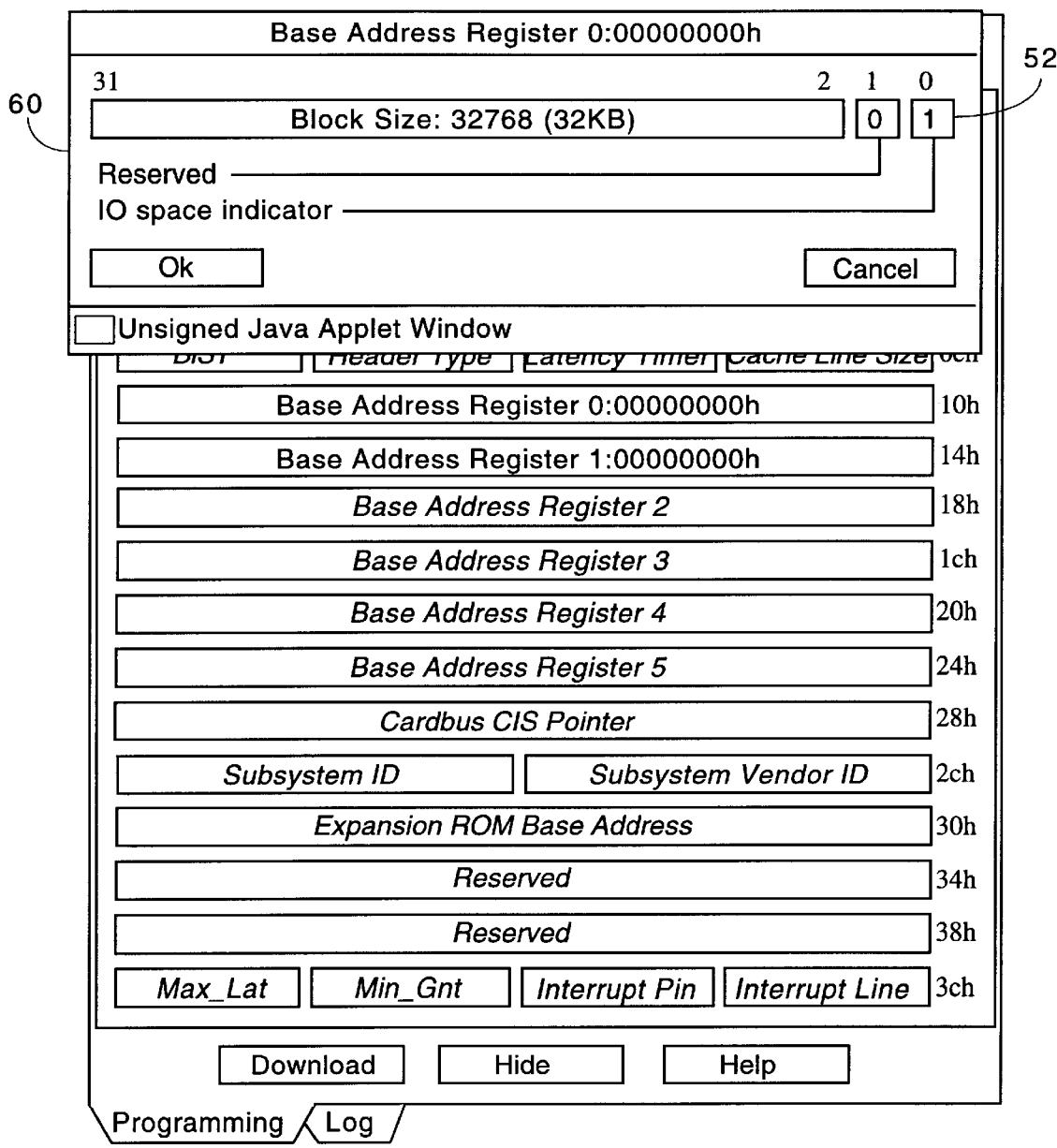
FIG. 16 shows a screen display after clicking on bit 0 of BAR 0 to change to an I/O display.

When button 52 is set to "1", BAR 0 is no longer configured for Memory. Instead, it becomes a space for configuring I/O, in accordance with the PCI SIG 2.1 PCI specification. Therefore, clicking on button 52 changes the screen display 20 to a new screen display 60, as shown in FIG. 16. Screen display 60 for I/O configuration sets the I/O block size. In this example, the user clicks on button 52 a second time to return to Memory screen display 20, shown in FIG. 15.

Figure 17:
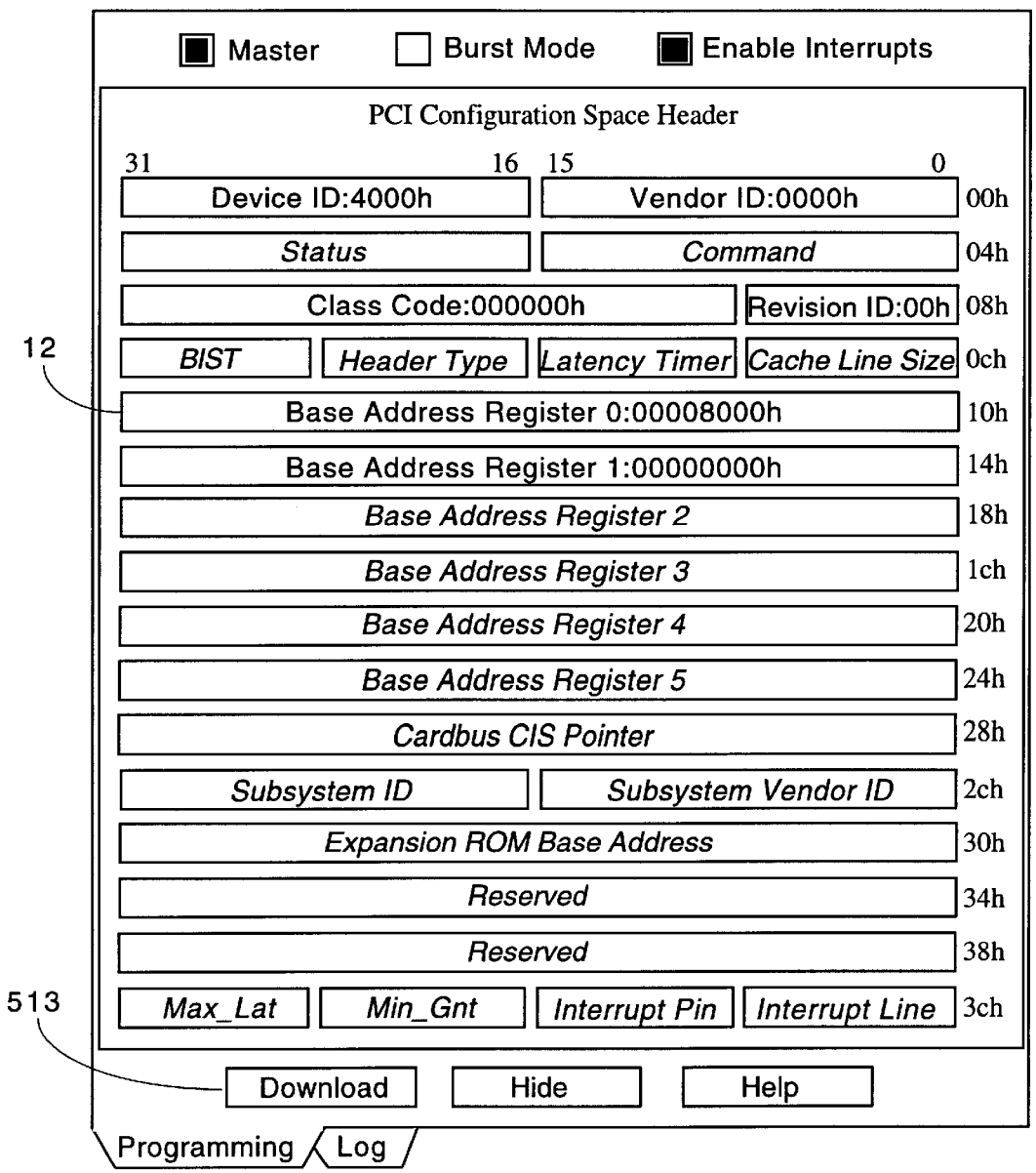
FIG. 17 shows the "Programming" screen display after clicking on "Ok" in the screen display of FIG. 15 to accept the selected BAR configuration.

Clicking on Ok button 53 in FIG. 15 accepts the selection and removes screen display 20, as shown in FIG. 17. Note that BAR 0 button 12 is now labeled with the selected value. Since in this example buttons 50, 51 and 52 were not altered from their default "0" values, the four least significant bits of BAR 0 are still "0".

Optional Error Checks

8. Not all combinations of parameters lead to a valid configuration for a PCI circuit. As the user selects parameters, a concurrent background error checking procedure may be executed on the user data, if desired, to ensure that the selected parameters will lead to a valid configuration for a PCI circuit in the target device. The user interface may be programmed with one or more simple sets of rules. The rules may be specific to the target application. Errors may be communicated in "pop-up" dialog boxes, or written to a log file or screen.

As an alternative to, or in conjunction with, the above scheme, so-called software 'Wizards' may be used to guide the user through all or part of the desired parameter selection flow.

If not performed during parameter selection, error checking may optionally be performed after configuring the database, or before generating a netlist.

Configuring Design Database

9. When the user has completed all parameter selections, the user clicks on Download button 513 (see FIG. 17), which indicates to the user interface that the user is ready to transfer the design database to the Xilinx computer. In response, the user interface software enters the selected parameters into a design database, thereby configuring the database in accordance with the selected parameters.

Transmitting Design Database to Xilinx

10. The user interface then initiates a data transfer of the configured design database over the internet. The design database is transmitted from the user's computer to the Xilinx computer.

Compiling Design Database to Generate Netlist

11. On the same or another Xilinx computer, the design database is compiled and a netlist is generated that represents the PCI circuit in accordance with the parameters selected by the user. In one embodiment, the netlist format is either verilog, VHDL, EDIF, or the Xilinx Netlist Format (XNF), but could be any other kind of format, including encrypted data formats.

Transmitting Generated Netlist to User

12. The user interface initiates a data transfer of the generated netlist over the internet. The generated netlist is transmitted from the Xilinx computer to the user's computer.

Use of PCI Circuit in Design

13. In one embodiment, the generated netlist comprises one or more files. If the complete design for the programmable IC (of which the PCI circuit is at least a portion) is implemented using HDL, the user instantiates an HDL instantiation for the PCI netlist in the HDL code for the complete design, and implements connections between the inputs and outputs of the PCI circuit and the rest of the design. The instantiated netlist may be hierarchical and may include instantiations of one or more lower-level netlists, produced by the compilation step, that "customize" the configured PCI circuit. In one embodiment, the HDL instantiation is transmitted to the user by the Xilinx computer with the generated netlist.

If the complete design is implemented using a schematic entry tool, the user adds a schematic symbol representing the top-level PCI circuit to the schematic for the complete design, and connects the inputs and outputs of the symbol to the rest of the design. These inputs and outputs typically include data buses, address buses, and various control lines that must be connected to other logic or to symbols representing device I/O. When using the method of the invention, the placed schematic symbol for the PCI circuit references a netlist rather than a schematic. The same schematic symbol can always be used no matter how the PCI circuit is configured. This schematic symbol is preferably provided by the programmable IC vendor or the schematic software vendor. In one embodiment, the schematic symbol is transmitted to the user by the Xilinx computer with the generated netlist.

When the design is complete, the user typically processes the complete design to generate a single, flattened netlist, during which process the PCI circuit is merged with the rest of the design. The netlist for the complete design is then typically used to generate a bitstream, a sequence of data that is used to program a programmable IC.

Additional features of this aspect of the invention will be readily apparent to those skilled in the art, and include but are not limited to the capability of configuring multiple circuits (which may or may not be directed to multiple applications) with a single design database or a single user interface.

Third Aspect of the Invention

According to a third aspect of the invention, instead of or in addition to the user interface being used to configure a circuit, the user interface is used to display "read data" from an IC. (The term "read data" when used herein refers to any data that has been read from an IC, such as program data, for example.) The IC from which the data is read may be a programmable IC, and may have been programmed to include a previously configured circuit, or the IC may be a non-programmable IC. In this embodiment, the displayed read data comprises at least a portion of the PCI CSH, read back from a previously programmed programmable IC. This method is of significant value to users in the debugging phase of a design and when attempting to bring up a design in a board early in the design process. In order to display read data from a programmable IC that has been programmed to include a previously configured circuit, the user must have access to that part of the programmable IC's addressable memory that is represented by the displayed memory map. This data is accessed via either a predetermined address (which is determined by the designer of the PCI system) or by running a Basic Input/Output Services (BIOS) routine in a computer. Either method is well known to those of ordinary skill in the relevant arts. The communications software retrieves the read data from the IC, then writes or transfers the read data to the user's computer. Formats that can be used for writing the read data include but are not limited to memory maps, simulation output, log files, or the design database format used by the user interface. The user interface then accesses the read data and displays it in table-based format, in the form of a memory map where appropriate. Whatever the source of the read data, error checking can be performed to validate the read data. Additional error checking can be provided, such as comparing read data with previously written data held in a log or reference file.

Fourth Aspect of the Invention

According to a fourth aspect of the invention, in addition to compiling the design database and generating a netlist, the second computer may also place and route the resulting netlist. The resulting placed and routed design may then optionally be transmitted over the data communications network to the user. Further, the second computer may generate a device program file such as an FPGA bitstream, which may then optionally be transmitted over the data communications network to the user.

Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

What is claimed is:

1. A method of off-loading work from a computer while generating a netlist representing a circuit, the method comprising:

on a first computer, receiving a selection of parameters from a user, the parameters being specified by the user based on desired characteristics for the circuit;

on the first computer, entering the parameters in a design file;

transmitting the design file from the first computer to a second computer over a data communications link;

remotely compiling, on the second computer, the design file to generate the netlist; and transmitting the netlist from the second computer to the first computer over the data communications link.

2. The method of claim 1, wherein the data communications link comprises a Wide Area Network.

3. The method of claim 1, wherein the data communications link comprises a Local Area Network (LAN).

4. The method of claim 1, wherein the data communications link comprises first and second transducers forming links to each of the first and second computers, respectively.

5. The method of claim 1, further comprising:

remotely generating, on the second computer, a schematic symbol that represents the netlist; and transmitting the schematic symbol from the second computer to the first computer over the data communications link.

6. The method of claim 1, further comprising:

remotely generating, on the second computer, an HDL instantiation that represents the netlist; and transmitting the HDL instantiation from the second computer to the first computer over the data communications link.

7. A method of off-loading work from a computer while placing and routing a circuit, the method comprising:

on a first computer, receiving a selection of parameters from a user, the parameters being specified by the user based on desired characteristics for the circuit;

on the first computer, entering the parameters in a design file;

transmitting the design file from the first computer to a second computer over a data communications link;

remotely generating, on the second computer, a placed and routed design from the design file; and transmitting the placed and routed design from the second computer to the first computer over the data communications link.

8. The method of claim 7, wherein the data communications link comprises a Wide Area Network.

9. The method of claim 7, wherein the data communications link comprises a Local Area Network (LAN).

10. The method of claim 7, wherein the data communications link comprises first and second transducers forming links to each of the first and second computers, respectively.

11. A method of off-loading work from a computer while generating a device program file representing at least a portion of a programmable integrated circuit (IC), the method comprising:

on a first computer, receiving a selection of parameters from a user, the parameters being specified by the user based on desired characteristics for a circuit to be implemented in the programmable IC;

on the first computer, entering the parameters in a design file;

transmitting the design file from the first computer to a second computer over a data communications link;

remotely generating, on the second computer, the device program file from the design file; and transmitting the device program file from the second computer to the first computer over the data communications link.

12. The method of claim 11, wherein the data communications link comprises a Wide Area Network.

13. The method of claim 11, wherein the data communications link comprises a Local Area Network (LAN).

14. The method of claim 11, wherein the data communications link comprises first and second transducers forming links to each of the first and second computers, respectively.

15. A method of off-loading work from a computer while generating a schematic symbol for a logic circuit, the method comprising:

entering, on a first computer, data descriptive of the logic circuit;

transmitting the data from the first computer to a second computer over a data communications link;

remotely generating, on the second computer, the schematic symbol from the transmitted data; and transmitting the schematic symbol from the second computer to the first computer over the data communications link.

16. The method of claim 15, wherein the data communications link comprises a Wide Area Network.

17. The method of claim 15, wherein the data communications link comprises a Local Area Network (LAN).

18. The method of claim 15, wherein the data communications link comprises first and second transducers forming links to each of the first and second computers, respectively.

19. A method of off-loading work from a computer while generating an HDL instantiation for a logic circuit, the method comprising:

entering, on a first computer, data descriptive of the logic circuit;

transmitting the data from the first computer to a second computer over a data communications link;

remotely generating, on the second computer, the HDL instantiation from the transmitted data; and transmitting the HDL instantiation from the second computer to the first computer over the data communications link.

20. The method of claim 19, wherein the data communications link comprises a Wide Area Network.

21. The method of claim 19, wherein the data communications link comprises a Local Area Network (LAN).

22. The method of claim 19, wherein the data communications link comprises first and second transducers forming links to each of the first and second computers, respectively.

* * * * *